United States Patent
Eum

(10) Patent No.: US 9,794,027 B2
(45) Date of Patent: Oct. 17, 2017

(54) METHOD AND APPARATUS FOR GENERATING FRAMES FOR ERROR CORRECTION

(71) Applicant: Electronics and Telecommunications Research Institute, Daejeon (KR)

(72) Inventor: Ho Min Eum, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 253 days.

(21) Appl. No.: 14/723,912

(22) Filed: May 28, 2015

(65) Prior Publication Data

US 2015/0349915 A1 Dec. 3, 2015

(30) Foreign Application Priority Data

May 29, 2014 (KR) .................. 10-2014-0065445

(51) Int. Cl.
*H04L 1/00* (2006.01)
*H04L 12/939* (2013.01)
*H03M 7/30* (2006.01)

(52) U.S. Cl.
CPC ............ *H04L 1/0083* (2013.01); *H04L 1/007* (2013.01); *H03M 7/30* (2013.01)

(58) Field of Classification Search
None
See application file for complete search history.

(56) References Cited

U.S. PATENT DOCUMENTS

| 6,223,324 | B1 | 4/2001 | Sinha et al. |
| 9,160,361 | B2 * | 10/2015 | Inoue ..................... H03M 7/30 |
| 2006/0090118 | A1 | 4/2006 | Olivieri |
| 2010/0046415 | A1 | 2/2010 | Kim et al. |
| 2010/0302359 | A1 * | 12/2010 | Adams .................. B64C 39/024 348/117 |

FOREIGN PATENT DOCUMENTS

KR 1020040083511 A 10/2004

* cited by examiner

*Primary Examiner* — Vinncelas Louis
(74) *Attorney, Agent, or Firm* — William Park & Associates Ltd.

(57) ABSTRACT

A method and apparatus for generating frames to apply error correction to data including a plurality of consecutive data groups are provided. Upon receiving input of an n-th data group consisting of a plurality of priority groups with different priority levels, the number of first code rate frames, which is the number of frames in the n-th data group for which a first code rate is used, is calculated based on the number of first code rate bits calculated based on the ratio of the length of data in an (n−1)-th data group for which the first code rate is used. The number of second code rate frames, which is the number of frames in the n-th data group for which the second code rate is used, is calculated based on the number of second code rate bits calculated based on the number of first code rate bits. Frames for error correction are generated based on the number of first code rate frames and the number of second code rate frames.

14 Claims, 7 Drawing Sheets

METHOD AND APPARATUS FOR GENERATING FRAMES FOR ERROR CORRECTION

CROSS-REFERENCE TO RELATED APPLICATION

This application claims priority to and the benefit of Korean Patent Application No. 10-2014-0065445 filed in the Korean Intellectual Property Office on May 29, 2014, the entire contents of which are incorporated herein by reference.

BACKGROUND OF THE INVENTION (a) Field of the Invention

The present invention relates to a method and apparatus for generating frames for error correction to perform unequal error protection.

(b) Description of the Related Art

In wired or wireless transmission of multimedia data, multimedia data is compressed using a certain compression standard to reduce the amount of data, due to limited transmission capacity. In this instance, the worse the transmission channel becomes, the higher the bit error rate (BER) and the lower the picture quality or audio quality of decoded multimedia data becomes.

The bit error rate may be improved by forward error correction (FEC) in a physical layer or video layer of a transmission system. Error correction performance is determined by code rate if the length and type of a code word are constant. The lower the code rate, the higher the error correction performance.

Compressed video data has a different priority level within the same GOP (group of pictures) or picture, depending on how much an error can affect reception performance. Compressed video data may have various levels of priority for different layers (i.e., GOP layer, picture layer, slice layer, etc.).

In FEC for error protection of compressed multimedia data, the use of different code rates for each priority level is referred to as unequal error protection, and the use of the same code rate for all data regardless of priority is referred to as equal error protection (EEP).

Given the same payload rate and the same bit error rate, unequal error protection, compared with equal error protection, gives better picture quality or audio quality for decoded data. Unequal error protection uses two or more different code rates. Thus, it is difficult to maintain a constant payload rate when data length or position varies with priority.

Accordingly, in general, a transmission system requiring a constant payload rate uses equal error protection, and a transmission system using a variable payload rate uses unequal error protection. In a system that allows for constant payload rate and fixed data length or position for each priority level, either equal error protection or unequal error protection can be used, but the latter gives better performance.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method and apparatus for generating frames which allow for a constant payload rate when unequal error protection is applied to a physical layer according to priority in wired or wireless communication of compressed video data.

An exemplary embodiment of the present invention provides a method for generating frames to apply error correction to data including a plurality of consecutive data groups, the method including: upon receiving input of an n-th data group consisting of a plurality of priority groups with different priority levels, calculating a number of first code rate bits, which is a number of data bits in the n-th data group for which a first code rate is to be used, based on a ratio of a length of data in an (n−1)-th data group for which the first code rate is used; calculating a number of first code rate frames, which is the number of frames in the n-th data group for which the first code rate is used, based on the number of first code rate bits; calculating a number of second code rate bits, which is a number of data bits in the n-th data group for which a second code rate is used, based on the number of first code rate bits; calculating a number of second code rate frames, which is a number of frames in the n-th data group for which the second code rate is used, based on the number of second code rate bits; and generating frames for which the first code rate is used based on the number of first code rate frames and generating frames for which the second code rate is used based on the number of second code rate frames.

The calculating of the number of first code rate bits may include: calculating a ratio of a first code rate length, which is the ratio of the length of data in the (n−1)-th data group for which the first code rate is used; comparing the ratio of the first code rate length with a predetermined ratio; if the ratio of first code rate length is not consistent with the predetermined ratio, correcting the ratio of the first code rate length; and calculating the number of first code rate bits based on the corrected ratio of the first code rate length.

In the correcting of the ratio of first code rate length, the corrected ratio of the first code rate length may be calculated by subtracting the ratio of the first code rate length from the predetermined ratio and then adding a new predetermined ratio to the difference.

In the calculating of the number of first code rate bits, the number of first code rate bits in the n-th data group may be calculated by adding the length of the n-th data group and a number of non-encoded data bits in the (n−1)-th data group and then multiplying the sum by the corrected ratio of the first code rate length.

In the calculating of the number of first code rate frames, the number of first code rate frames may be calculated by adding the number of first code rate bits in the n-th data group and a number of non-encoded data bits in the n-th data group and then dividing the sum by a predetermined number of bit strings.

In the calculating of the number of second code rate bits, the number of second code rates may be calculated by removing the first code rate bits from the n-th data group.

In the calculating of the number of second code rate frames, the number of second code rate frames may be calculated by adding the number of second code rate bits in the n-th data group and the number of non-encoded data bits in the n-th data group and then dividing the sum by a predetermined number of bit strings.

A data group may be split into a first priority group to which a first priority level is given and a second priority group to which a second priority level is given, and the first priority level may be higher than the second priority level.

If the length of the first priority group is referred to as "first group length" and the length of the second priority group is referred to as "second group length", the number of first code rate bits may be greater than the first group length, and the number of second code rate bits may be less than the second group length.

Another exemplary embodiment of the present invention provides an apparatus for generating frames to apply error correction to data including a plurality of consecutive data groups, the apparatus including: a number-of-first-code-rate-bits calculator that, upon receiving input of an n-th data group consisting of a plurality of priority groups with different priority levels, calculates a number of first code rate bits, which is a number of data bits in an n-th data group for which a first code rate is to be used, based on a ratio of a length of data in an (n−1)-th data group for which the first code rate is used; a number-of-first-code-rate-frames calculator that calculates a number of first code rate frames, which is a number of frames in the n-th data group for which the first code rate is used, based on the number of first code rate bits; a number-of-second-code-rate-bits calculator that calculates a number of second code rate bits, which is a number of data bits in the n-th data group for which a second code rate is used, based on the number of first code rate bits; a number-of-second-code-rate-frames calculator that calculates a number of second code rate frames, which is a number of frames in the n-th data group for which the second code rate is used, based on the number of second code rate bits; and a frame generator that generates frames for which the first code rate is used based on the number of first code rate frames and generates frames for which the second code rate is used based on the number of second code rate frames.

The apparatus may further include a length ratio corrector that corrects the ratio of a first code rate length if the ratio of the first code rate length, which is a ratio of the length of data in the (n−1)-th data group for which the first code rate is used, is not consistent with a predetermined ratio.

The length ratio corrector may calculate the corrected ratio of the first code rate length by subtracting the ratio of first code rate length from the predetermined ratio and then adding a new predetermined ratio to the difference.

The number-of-first-code-rate-bits calculator may calculate the number of first code rate bits in the n-th data group by adding the length of the n-th data group and the number of non-encoded data bits in the (n−1)-th data group and then multiplying the sum by the corrected ratio of first code rate length.

The number-of-first-code-rate-frames calculator may calculate the number of first code rate frames by adding the number of first code rate bits in the n-th data group and the number of non-encoded data bits in the n-th data group and then dividing the sum by a predetermined number of bit strings.

The number-of-second-code-rate-bits calculator may calculate the number of second code rate bits by removing the first code rate bits from the n-th data group.

The number-of-second-code-rate-frames calculator may calculate the number of second code rate frames by adding the number of second code rate bits in the n-th data group and the number of non-encoded data bits in the n-th data group and then dividing the sum by a predetermined number of bit strings.

DETAILED DESCRIPTION OF THE EMBODIMENTS

Figure 1:
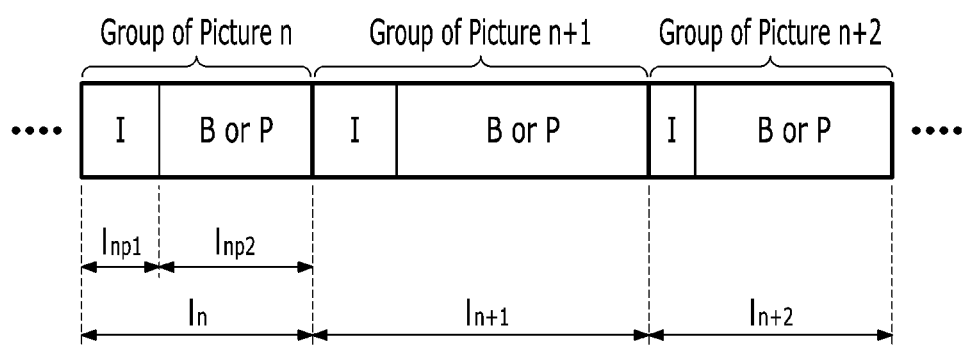
FIG. 1 is an illustration showing the structure of compressed video data.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Hereinafter, a method and apparatus for generating frames for error correction to perform unequal error protection according to an exemplary embodiment of the present invention will be described.

In wired or wireless transmission of multimedia data, multimedia data is compressed due to limited transmission capacity. Compressed video data has a different priority level within the same GOP (group of pictures) or picture, depending on how much an error can affect reception performance. Compressed video data may have various levels of priority for different layers (i.e., GOP layer, picture layer, slice layer, etc.).

For example, an I picture, which is an intra picture, a P picture, which is a predicted picture, and a B picture, which is a bidirectional picture, may exist within a GOP layer, and priority is given by I>P>B. In picture decoding, the I picture may be decoded by itself, the P picture is decoded with reference to the I picture, and the B picture is decoded with reference to the I picture and the P picture. Accordingly, a bit error in the I picture is propagated as far as the B and P pictures. Hence, the I picture has higher priority than the B picture and the P picture, and accordingly the P picture has higher priority than the B picture.

The priority of compressed video data may be split into two or more levels and grouped together according to a given criterion. Within each picture, the picture header has higher priority than picture data such as a DCT (discrete cosine transform) coefficient or a motion vector, and the motion vector has higher priority than the DCT coefficient.

Within a GOP of a given length, important information of highest priority, such as picture header, may be grouped together and arranged consecutively, regardless of the order of transmission of pictures, and data of second highest priority may be arranged as a second group.

In FEC for error protection of compressed multimedia data, unequal error protection may be applied using different code rates according to priority, and equal error protection (EEP) may be applied using the same code rate for all data regardless of priority.

FIG. 1 is an illustration showing the structure of compressed video data.

Compressed multimedia data, in general, includes consecutive data groups of a specific length. For compressed video such as MPEG-1/2/4 or H.26x, one I picture and a plurality of B and P pictures constitute a single data group, i.e., GOP (group of pictures), and GOPs of a certain length are arranged consecutively, as shown in FIG. 1. Each GOP may differ in length as in $l_n \neq l_{n+1} \neq l_{n+2}$, and accordingly the length of the I picture and the lengths of the B and P pictures may also differ. That is, as in $l_{np1} \neq l_{(n+1)p1} \neq l_{(n+2)p1}$, $l_{np2} \neq l_{(n+1)p2} \neq l_{(n+2)p2}$, the length of the I picture and the lengths of the B and P pictures may vary between different GOPs.

Figure 2:
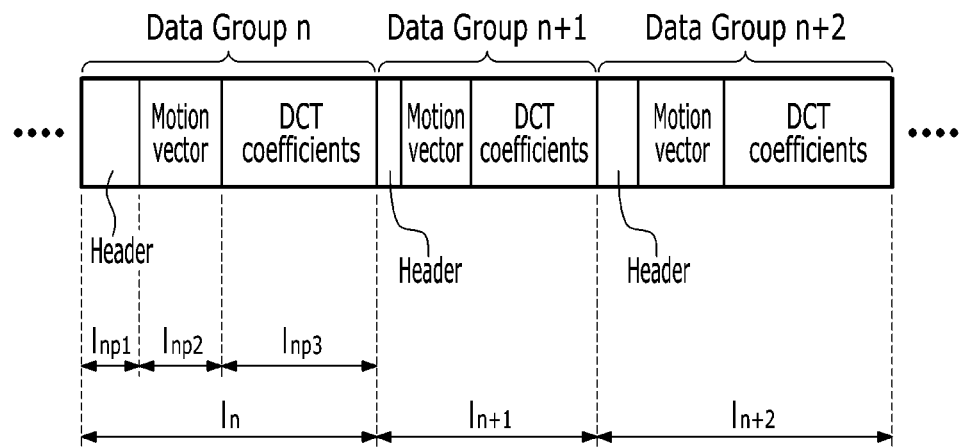
FIG. 2 is an illustration showing prioritization of compressed video data.

FIG. 2 is an illustration showing prioritization of compressed video data.

Priority levels may be assigned to data within a data group of compressed video data, as shown in FIG. 2. A data group may include a header, a motion vector, and a DCT coefficient, as shown in FIG. 1. Priority is given by header>motion vector>DCT coefficient. Provided that data with a priority level is a priority group, the length of the priority group may vary between different data groups because each data group may differ in length as in $l_n \neq l_{n+1} \neq l_{n+2}$. That is, as in $l_{np1} \neq l_{(n+1)p1} \neq l_{(n+2)p1}$, $l_{np2} \neq l_{(n+1)p2} \neq l_{(n+2)p2}$, $l_{np3} \neq l_{(n+1)p3} \neq l_{(n+2)p3}$, the length of the priority group may vary between data groups.

Accordingly, in transmission of a stream with such a data structure as shown in FIGS. 1 and 2, equal error protection is generally used since data groups and priority groups vary in length.

In the MPEG Audio layer II standard, an audio stream has a data structure including consecutive audio frames of constant length.

For DAB (digital audio broadcasting) audio frames, data groups, i.e., frames, are of constant length within the same audio stream, and priority groups within a frame are of equal length in all frames.

Figure 3:
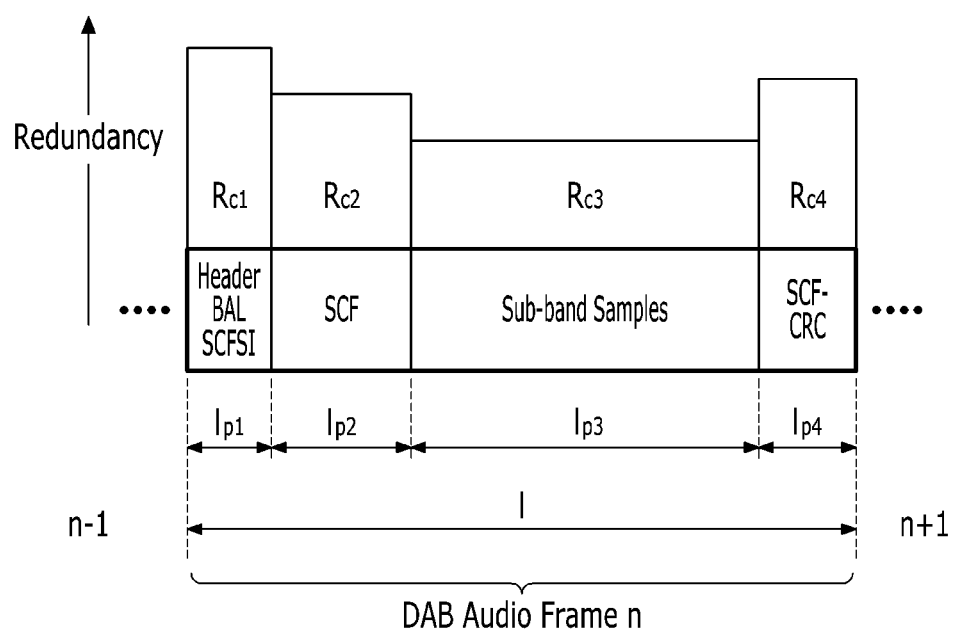
FIG. 3 is a view showing unequal error protection for DAB.

FIG. 3 is a view showing unequal error protection for DAB.

In DAB, frame length l is constant in all frames, and the lengths $l_{p1}$, $l_{p2}$, $l_{p3}$, $l_{p4}$ of priority groups within a frame are constant in all frames. Accordingly, the payload rate is kept constant, even with varying FEC code rates $R_{c1}$, $R_{c2}$, $R_{c3}$, $R_{c4}$ for different priority groups within a frame. The lengths of the priority groups are in the order $l_{p1} < l_{p4} < l_{p2} < l_{p3}$, and the code rates for the priority groups are in the order $R_{c1} < R_{c4} < R_{c2} < R_{c3}$.

In the exemplary embodiment of the present invention, when unequal error protection is applied to compressed multimedia data, the number of FEC frames can be adjusted in accordance with the code rate, even if the length of consecutive data groups and the length of priority groups in each data group are not constant, thereby maintaining a constant payload rate.

Figure 4:
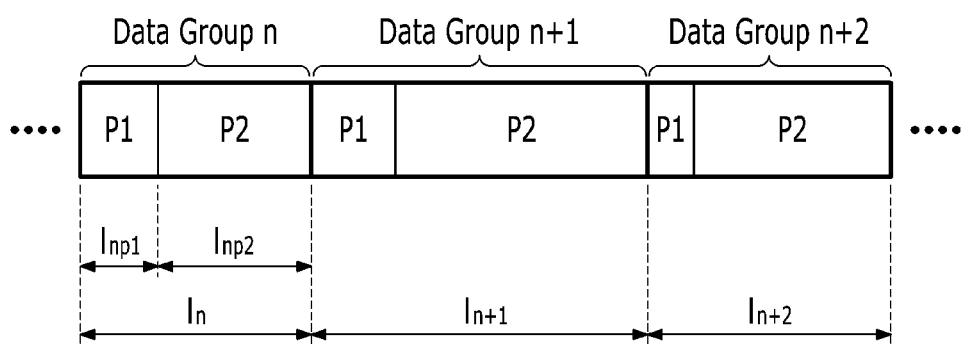
FIG. 4 is a view showing the structure of compressed multimedia data according to an exemplary embodiment of the present invention.

FIG. 4 is a view showing the structure of compressed multimedia data according to an exemplary embodiment of the present invention, which particularly illustrates a sequence of compressed multimedia data.

In the exemplary embodiment of the present invention, a description will be given of an example where compressed multimedia data includes a plurality of consecutive data groups, and each data group is split into two priority groups.

As shown in FIG. 4, if one data group is split into priority group P1 and priority group P2, the length of priority group P1 and the length of priority group P2 may vary between different data groups. That is, as in $l_{np1} \neq l_{(n+1)p1} \neq l_{(n+2)p1}$, $l_{np2} \neq l_{(n+1)p2} \neq l_{(n+2)p2}$, the length of priority groups may vary between different data groups. Priority group P1 has higher priority than priority P2 (P1>P2), the lengths of the priority groups are assumed to be $l_{np1} < l_{np2}$, and the positions of P1 and P2 may be inverse to each other.

Figure 5:
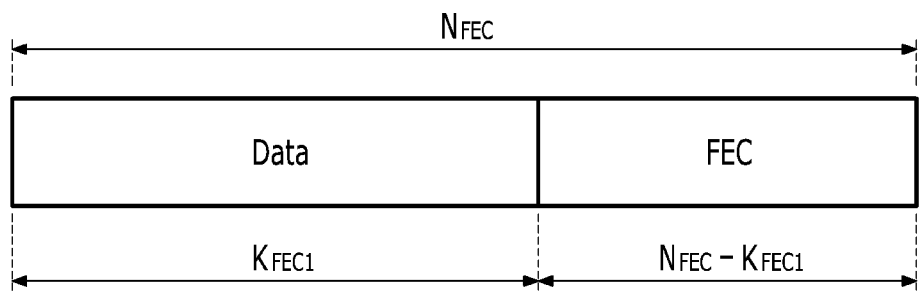
FIG. 5 and FIG. 6 are views showing the structure of an FEC frame according to an exemplary embodiment of the present invention.
Figure 6:
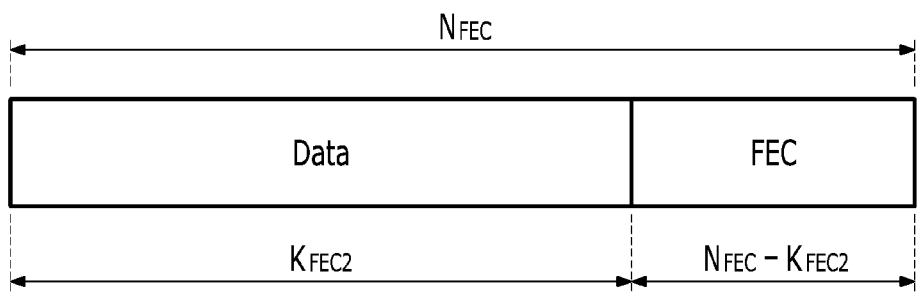

When applying FEC to data groups each having priority groups, two different code rates are used. The structure of an FEC frame is as shown in FIG. 5 and FIG. 6. FIG. 5 and FIG. 6 are views showing the structure of an FEC frame according to an exemplary embodiment of the present invention. FIG. 5 shows the structure of an FEC frame with a code rate $R_{c1} (=K_{FEC1}/N_{FEC})$, and FIG. 6 shows the structure of an FEC frame with a code rate $R_{c2} (=K_{FEC2}/N_{FEC})$. The two code rates are set to be $R_{c1} < R_{c2}$.

Figure 7:
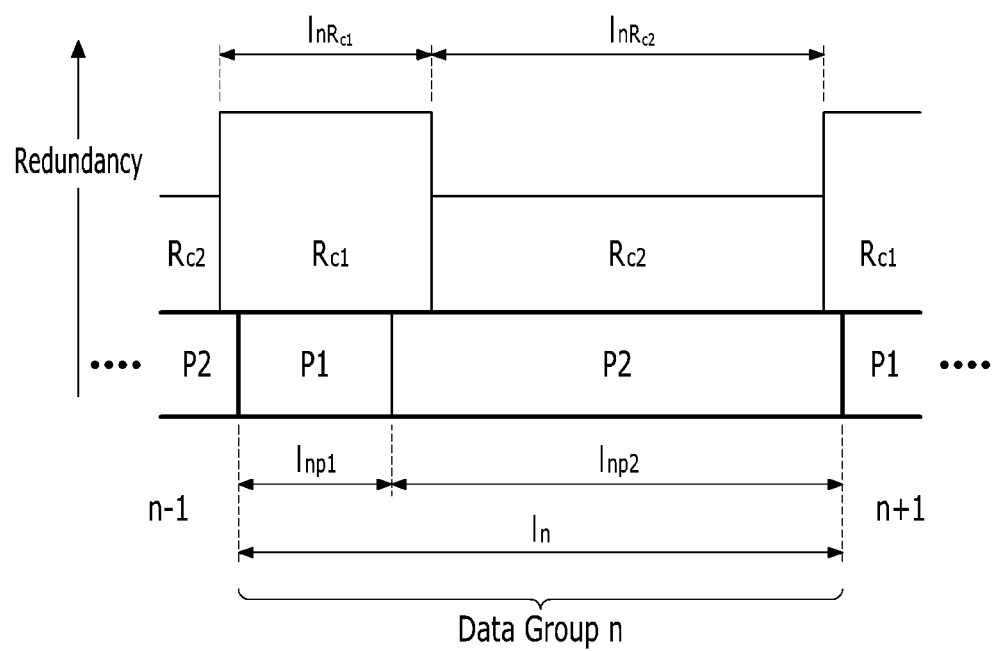
FIG. 7 is a view showing application of unequal error protection according to an exemplary embodiment of the present invention.

FIG. 7 is a view showing application of unequal error protection according to an exemplary embodiment of the present invention.

The numbers of data bits $l_{nR_{c1}}$ and $l_{nR_{c2}}$ for which code rates $R_{c1}$ and $R_{c2}$ are respectively used always have to satisfy $l_{nR_{c1}} > l_{np1}$ and $l_{nR_{c2}} < l_{np2}$ within all data groups in a stream, to avoid the code rate $R_{c2}$ from being used for data of the group P1 with higher priority.

To this end, the number of data bits $l_{nR_{c1}}$ for which the code rate $R_{c1}$ is used and the number of data bits $l_{nR_{c2}}$ for which the code rate $R_{c2}$ is used may be calculated as follows.

$$l_{nR_{C1}} = K_{FEC1} \cdot M_n \quad \text{(Equation 1)}$$

Herein, $K_{FEC1}$ indicates the number of bit strings of a frame for which the code rate $R_{c1}$ is used, and $M_n$ indicates the number of frames for which the code rate $R_{c1}$, which is an integer, is used.

$$l_{nR_{C2}} = K_{FEC2} \cdot N_n \quad \text{(Equation 2)}$$

Herein, $K_{FEC2}$ indicates the number of bit strings of a frame for which the code rate $R_{c2}$ is used, and $N_n$ indicates the number of frames for which the code rate $R_{c2}$, which is an integer, is used.

All data within a data group may be split into $K_{FEC1}$ or $K_{FEC2}$ bit strings to create an FEC frame of a predetermined length, as shown in FIGS. 5 and 6. At this point, the length $l_n$ of an n-th data group is not exactly split into $K_{FEC1}$ or $K_{FEC2}$ length units. Hence, to maintain a constant payload rate, the number of FEC frames for which the code rate $R_{c1}$ is used and the number of FEC frames for which the code rate $R_{c2}$ is used have to be properly adjusted.

In the exemplary embodiment of the present invention, the number of FEC frames in the n-th data group for which the code rate $R_{c1}$ is used and the number of FEC frames in the n-th data group for which the code rate $R_{c2}$ is used are calculated as follows.

$$\left\{ R_l + R_l - \frac{M_{n-1}}{(M_{n-1} + N_{n-1})} \right\} \cdot (l_n + r_{FEC2,n-1}) = \quad \text{(Equation 3)}$$

$$K_{FEC1} \cdot M_n - r_{FEC1,n},$$

$0 \leq r_{FEC1,n} < K_{FEC1}$ $l_{nR_{C1}} = K_{FEC1} \cdot M_n$ $0 < R_l < 1$, $M_n$: Integer Initial Values: $\frac{M_0}{(M_0 + N_0)} = R_l$, $r_{FEC2,0} = 0$ -continued $$(l_n + r_{FEC2,n-1}) - K_{FEC1} \cdot M_n = K_{FEC2} \cdot N_n + r_{FEC2,n}, \quad \text{(Equation 4)}$$
$$0 \leq r_{FEC2,n} < K_{FEC2}$$
$$l_{nR_{C2}} = K_{FEC2} \cdot N_n$$
$N_n$: Integer
Initial Value: $r_{FEC2,0} = 0$ In Equation 3, $R_I$ is a predetermined value, which indicates an ideal ratio of the length of data in each data group of a stream for which the code rate $R_{c1}$ is to be used. For better comprehension and ease of description, $R_I$ is referred to as a predetermined ratio.

Within a single stream, the same $R_I$ value is used for each data group. In Equation 3 and Equation 4, $M_n$ and $N_n$ indicate the numbers of FEC frames in the n-th data group for which the code rate $R_{c1}$ and the code rate $R_{c2}$ are respectively used.

The numbers of FEC frames may be calculated by the following process.

When an n-th data group is input, the ratio $$\frac{M_{n-1}}{(M_{n-1} + N_{n-1})}$$

of the length of data in an (n−1)-th data group for which the code rate $R_{c1}$ is used may be calculated by Equation 3, based on the numbers of FEC frames $M_{n-1}$ and $N_{n-1}$ used in the (n−1)-th data group.

If the calculated ratio $$\frac{M_{n-1}}{(M_{n-1} + N_{n-1})}$$

of the length of data is not consistent with a predetermined ratio $R_I$, the ratio of the length of data for which the code rate $R_{c1}$ is to be used is re-calculated based on the predetermined ratio $R_I$, as in $$\left\{ R_I + R_I - \frac{M_{n-1}}{(M_{n-1} + N_{n-1})} \right\},$$

in order to correct an error in the (n−1)-th data group. The ratio of the length of data calculated by $$\left\{ R_I + R_I - \frac{M_{n-1}}{(M_{n-1} + N_{n-1})} \right\}$$

is referred to as the corrected ratio of the length of data for ease of explanation.

The corrected ratio of the length of data for which the code rate $R_{c1}$ is to be used is calculated, and then the calculated value is multiplied by the sum of the length $l_n$ of the n-th data group and the number $r_{FEC2,n-1}$ of non-encoded data bits in the (n−1)-th data group, thereby calculating the number of data bits in the n-th data group for which the code rate $R_{c1}$ is to be used. An integer value $M_n$ satisfying the right side of the first equation of Equation 3, i.e., the number of FEC frames for which the code rate $R_{c1}$ is to be used, may be calculated based on the number of data bits in the n-th data group for which the code rate $R_{c1}$ is used.

Meanwhile, the number $N_n$ of FEC frames for which the code rate $R_{c2}$ is used may be calculated based on Equation 4.

First of all, the number of data bits for which the code rate $R_{c2}$ is to be used equals the number of bits left after the data bits for which the code rate $R_{c2}$ is to be used are removed from the n-th data group, which is given by $(l_n + r_{FEC2,n-1}) - K_{FEC1} \cdot M_n$.

In the same manner as Equation 3, an integer value $N_n$ satisfying the right side of the first equation of Equation 4, i.e., the number of FEC frames for which the code rate $R_{c2}$ is to be used, may be calculated based on the number of data bits for which the code rate $R_{c2}$ is used.

As described above, when the numbers $M_n$ and $N_n$ of FEC frames for which the code rates $R_{c1}$ and $R_{c2}$ are respectively used are calculated based on Equations 3 and 4, $M_n$ FEC frames for which the code rate $R_{c1}$ is used from the starting bit and $N_n$ FEC frames for which the code rate $R_{c2}$ is used from the starting bit are generated. Using the aforementioned method, the average payload rate may be maintained constant while applying unequal error protection.

Next, a method for generating frames for error correction to perform unequal error protection according to an exemplary embodiment of the present invention will be described based upon the foregoing description.

Figure 8:
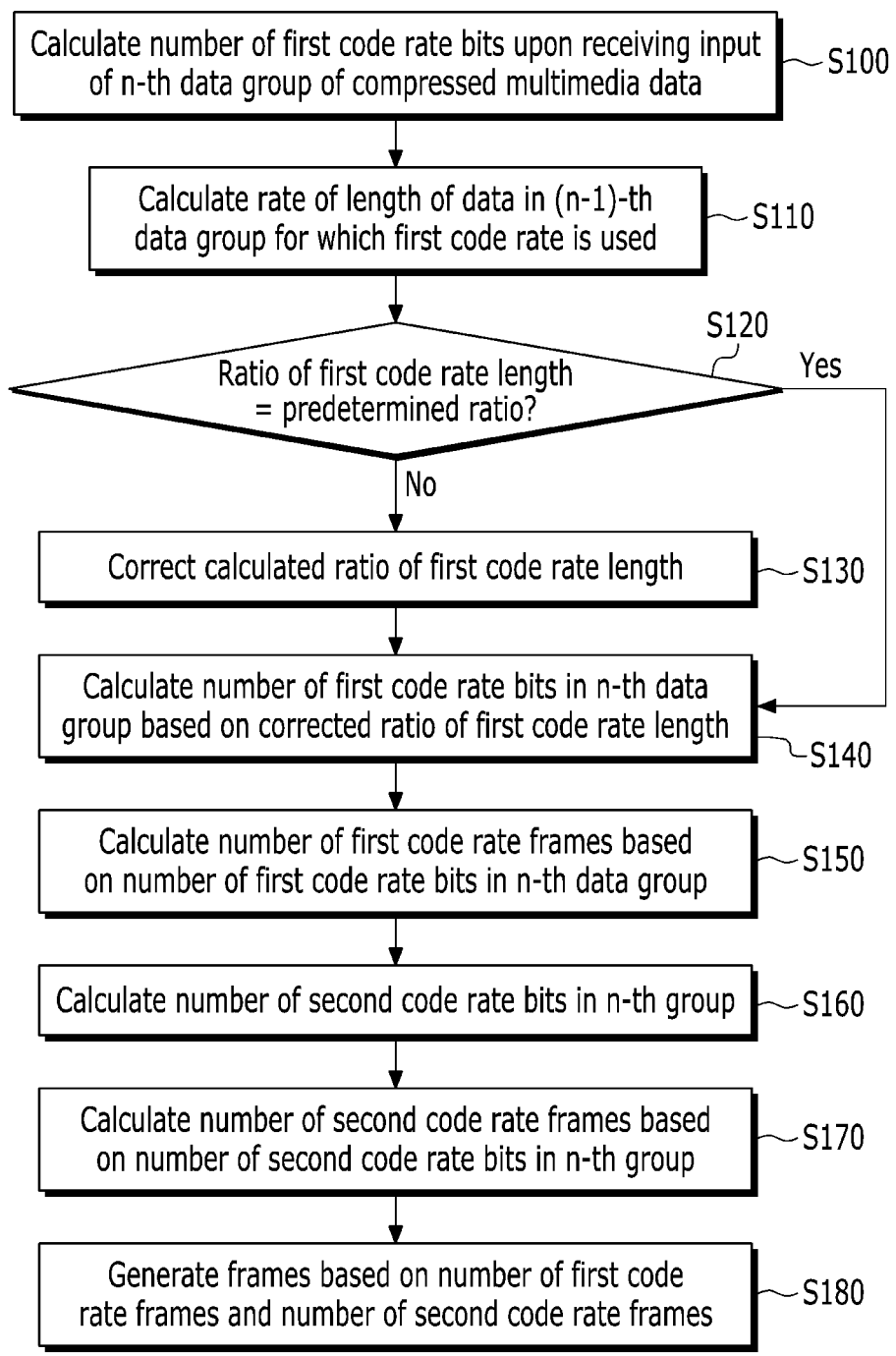
FIG. 8 is a flowchart of a method for generating frames for error correction according to an exemplary embodiment of the present invention.

FIG. 8 is a flowchart of a method for generating frames for error correction according to an exemplary embodiment of the present invention.

Compressed multimedia data includes a plurality of consecutive data groups. Provided that each data group is split into two priority groups, each data group may vary in length and each priority group in a data group may also vary in length. A data group may be split into a first priority group to which a first priority level is given and a second priority group to which a second priority level is given. Here, the ordinal numbers—first and second—are given for identification.

For convenience of explanation, the first priority level is higher than the second priority level, and the length of the first priority group is referred to as "first group length" and the length of the second priority group is referred to as "second group length".

When applying FEC for error correction to data groups with these characteristics, different code rates are used. Here, it is assumed that a first code rate and a second code rate are used. The number of data bits for which the first code rate is used is referred to as "the number of first code rate bits" and the number of data bits for which the second code rate is used is referred to as "the number of second code rate bits". Here, the number of first code rate bits is greater than the first group length, and the number of second code rate bits is less than the second group length.

When applying FEC for error correction to each data group of compressed multimedia data, frames to which FEC is applied are generated as follows.

First of all, as shown in FIG. 8, a frame generating apparatus 1 calculates the number of first code rate bits, which is the number of data bits for which the first code rate is used (S100).

The frame generating apparatus 1 splits all input data in an n-th data group into a predetermined number of bit strings to create FEC frames of a predetermined length. In order to maintain a constant payload rate, the number of FEC frames for which the first code rate $R_{c1}$ is used and the number of FEC frames for which the second code rate $R_{c2}$ is used are calculated. For ease of explanation, the number of FEC frames for which the first code rate $R_{c1}$ is used is referred to as "the number of first code rate frames, and the number of FEC frames for which the second code rate $R_{c2}$ is used is referred to as "the number of second code rate frames".

To this end, the frame generating apparatus 1 calculates the ratio of the length of data in the (n−1)-th data group for which the first code rate is used, based on the number of first code rate frames and the number of second code rate frames, which are used for the (n−1)-th data group (S110). For convenience of explanation, the ratio of the length of data for which the first code rate is used is referred to as "the ratio of first code rate length".

The calculated ratio of first code rate length in the (n−1)-th data group is compared with a predetermined ratio $R_{c1}$ (S120).

If the ratio of first code rate length in the (n−1)-th data group is not consistent with the predetermined ratio, it is determined that an error has occurred. For error correction, the ratio of first code rate length in the (n−1)-th data group is corrected (S130). Specifically, the ratio of first code rate length in the (n−1)-th data group is corrected based on the predetermined ratio. That is, the corrected ratio of the first code rate length is calculated by subtracting the ratio of the first code rate length from the predetermined ratio and then adding a new predetermined ratio to the difference.

In this way, the number of first code rate bits, which is the number of data bits in the n-th data group for which the first code rate is to be used, is calculated based on the corrected ratio of the first code rate length in the (n−1)-th data group (S140). The number of first code rate bits in the n-th data group is calculated by adding the length of the n-th data group and the number of non-encoded data bits in the (n−1)-th data group and then multiplying the sum by the ratio of the first code rate length in the (n−1)-th data group. If the ratio of the first code rate length in the (n−1)-th data group is consistent with the predetermined ratio in S120, the number of first code rate bits may be calculated, without correction, based on the ratio of the first code rate length in the (n−1)-th data group calculated in S110.

Thereafter, the number of first code rate frames is calculated based on the number of first code rate bits in the n-th data group (S150). Based upon Equation 3, the number of FEC frames for which the first code rate $R_{c1}$ is used is calculated by adding the number of first code rate bits in the n-th data group and the number of non-encoded data bits in the n-th data group and then dividing the sum by a predetermined number of bit strings (S).

Next, the frame generating apparatus 1 calculates the number of second code rate bits, which is the number of data bits for which the second code rate $R_{c2}$ is used, in order to calculate the number of second code rate frames, which is the number of FEC frames in the n-th data group for which the second code rate $R_{c2}$ is used (S160). The number of second code rates is the number of bits left after the first code rate bits are removed from the n-th data group. The number of second rate bits may be calculated by subtracting a second value, obtained by multiplying the number of first code rate bits by a predetermined number of bit strings, from a first value, obtained by adding the length of the n-th data group and the number of non-encoded data bits in the (n−1)-th data group as in $(l_n+r_{FEC2,n-1})-K_{FEC1} \cdot M_n$.

Then, the number of second code rate frames is calculated based on the number of second code rate bits in the n-th data group (S170). Based upon Equation 4, the number of FEC frames for which the second code rate $R_{c2}$ is used is calculated by adding the number of second code rate bits in the n-th data group and the number of non-encoded data bits in the n-th data group and then dividing the sum by a predetermined number of bit strings.

Based on the number of first code rate frames and the number of second code rate frames thus calculated, FEC frames of a predetermined length for which the first code rate is used and FEC frames of a predetermined length for which the second code rate is used are generated by dividing all input data in the n-th data group by a predetermined number of bit strings (S180).

Figure 9:
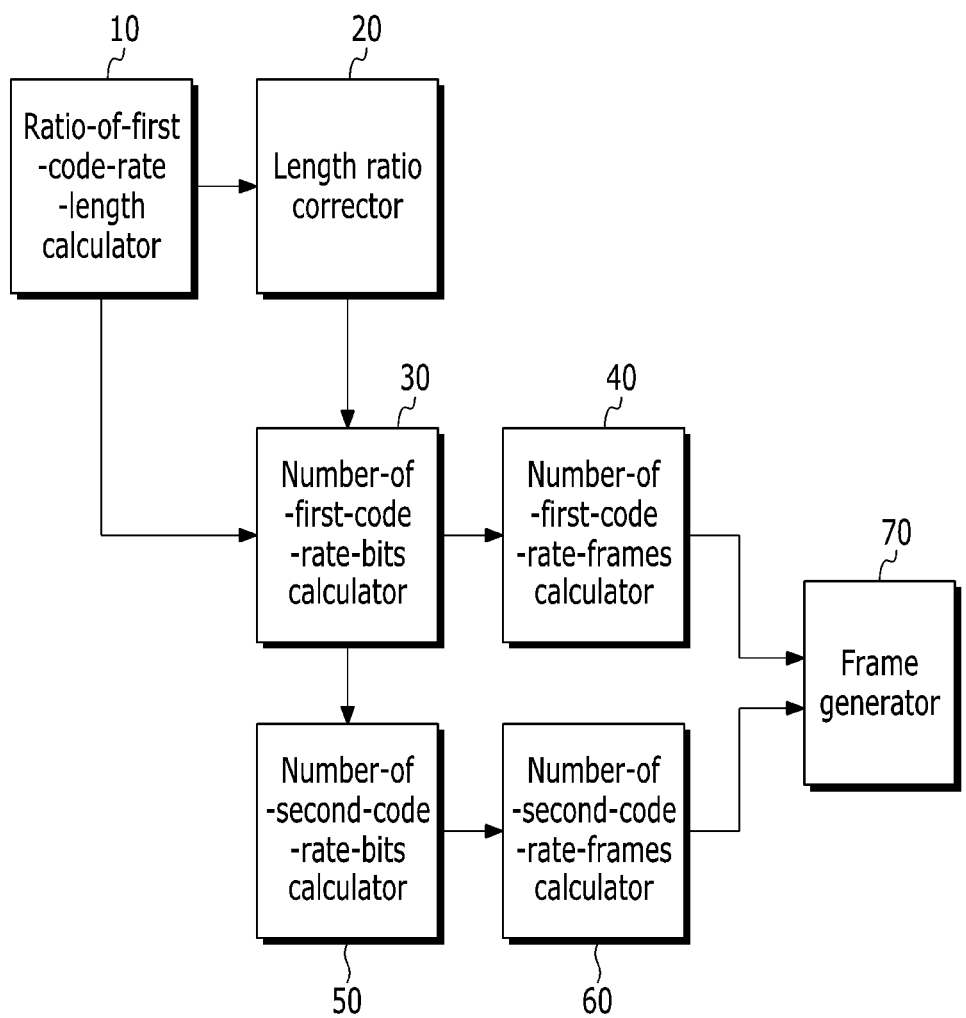
FIG. 9 is a view showing the structure of a frame generating apparatus according to an exemplary embodiment of the present invention.

FIG. 9 is a view showing the structure of a frame generating apparatus according to an exemplary embodiment of the present invention.

As shown in the attached FIG. 9, a frame generating apparatus 1 according to an exemplary embodiment of the present invention includes a ratio-of-first-code-rate-length calculator 10, a length ratio corrector 20, a number-of-first-code-rate-bits calculator 30, a number-of-first-code-rate-frames calculator 40, a number-of-second-code-rate-bits calculator 50, a number-of-second-code-rate-frames calculator 60, and a frame generator 70.

The ratio-of-first-code-rate-length calculator 10 calculates the ratio of the first code rate length, which is the ratio of the length of data in the (n−1)-th data group for which the first code rate is used for all input data in the n-th data group based on the number of first code rate frames, and the number of second code rate frames, which are used for the (n−1)-th data group.

The length ratio corrector 20 corrects the ratio of first code rate length if the ratio of first code rate length in the (n−1)-th data group is not consistent with a predetermined ratio. Specifically, the corrected ratio of the first code rate length may be calculated by subtracting the ratio of the first code rate length from the predetermined ratio and then adding a new predetermined ratio to the difference.

The number-of-first-code-rate-bits calculator 30 calculates the number of first code rate bits, which is the number of data bits in the n-th data group for which the first code rate is to be used, based on the corrected ratio of the first code rate length in (n−1)-th data group.

The number-of-first-code-rate-frames calculator 40 calculates the number of first code rate frames based on the number of first code rate bits in the n-th data group. Specifically, the number of first code rate frames is calculated by adding the number of first code rate bits in the n-th data group and the number of non-encoded data bits in the n-th data group and then dividing the sum by a predetermined number of bit strings.

The number-of-second-code-rate-bits calculator 50 calculates the number of second code rate bits, which is the number of data bits in the n-th data group for which the second code rate is to be used. The number of second code rate bits is the number of bits left after the first code rate bits are removed from the n-th data group.

The number-of-second-code-rate-frames calculator 60 calculates the number of second code rate frames based on the number of second code rate bits in the n-th data group. Specifically, the number of second code rate frames is calculated by adding the number of second code rate bits in the n-th data group and the number of non-encoded data bits in the n-th data group and then dividing the sum by a predetermined number of bit strings.

The frame generator 70 generates FEC frames of a predetermined length for which the first code rate is used, and generates FEC frames of a predetermined length for which the second code rate is used based on the number of first code rate frames and the number of second code rate frames, by dividing all input data in the n-th data group by a predetermined number of bit strings.

According to an embodiment of the present invention, when unequal error protection is applied to compressed multimedia data at varying FEC code rates, the number of FEC frames can be adjusted in accordance with the code rate, even if the length of consecutive data groups and the length of priority groups in each data group are not constant, thereby maintaining a constant payload rate.

The exemplary embodiments of the present invention are implemented not only through the apparatus and method, but may also be implemented through a program that realizes functions corresponding to constituent members of the exemplary embodiments of the present invention or a recording medium in which the program is recorded.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for generating frames to apply error correction to data including a plurality of consecutive data groups, the method comprising:
   processing computer executable program code embodied in a recording medium by at least one processor, the computer executable program code comprising:
   a program code that calculates, upon receiving input of an n-th data group consisting of a plurality of priority groups with different priority levels, a number of first code rate bits, which is a number of data bits in the n-th data group for which a first code rate is to be used, based on a ratio of a length of data in an (n−1)-th data group for which the first code rate is used;
   a program code that calculates a number of first code rate frames, which is the number of frames in the n-th data group for which the first code rate is used, based on the number of first code rate bits;
   a program code that calculates a number of second code rate bits, which is a number of data bits in the n-th data group for which a second code rate is used, based on the number of first code rate bits;
   a program code that calculates a number of second code rate frames, which is a number of frames in the n-th data group for which the second code rate is used, based on the number of second code rate bits; and
   a program code that generates frames for which the first code rate is used based on the number of first code rate frames and generating frames for which the second code rate is used based on the number of second code rate frames, and
   wherein the program code that calculates of the number of first code rate bits comprises:
   a program code that calculates a ratio of a first code rate length, which is the ratio of the length of data in the (n−1)-th data group for which the first code rate is used;
   a program code that calculates the ratio of the first code rate length with a predetermined ratio;
   a program code that corrects the ratio of the first code rate length if the ratio of first code rate length is not consistent with the predetermined ratio; and
   a program code that calculates the number of first code rate bits based on the corrected ratio of the first code rate length.

2. The method of claim 1, wherein, in the program code that corrects the ratio of the first code rate length, the corrected ratio of first code rate length is calculated by subtracting the ratio of the first code rate length from the predetermined ratio and then adding a new predetermined ratio to the difference.

3. The method of claim 1, wherein, in the program code that calculates of the number of first code rate bits, the number of first code rate bits in the n-th data group is calculated by adding the length of the n-th data group and a number of non-encoded data bits in the (n−1)-th data group and then multiplying the sum by the corrected ratio of first code rate length.

4. The method of claim 1, wherein, in the program code that calculates of the number of first code rate frames, the number of first code rate frames is calculated by adding the number of first code rate bits in the n-th data group and a number of non-encoded data bits in the n-th data group and then dividing the sum by a predetermined number of bit strings.

5. The method of claim 1, wherein, in the program code that calculates of the number of second code rate bits, the number of second code rate bits is calculated by removing the first code rate bits from the n-th data group.

6. The method of claim 1, wherein, in the program code that calculates of the number of second code rate frames, the number of second code rate frames is calculated by adding the number of second code rate bits in the n-th data group and a number of non-encoded data bits in the n-th data group and then dividing the sum by a predetermined number of bit strings.

7. The method of claim 1, wherein a data group is split into a first priority group to which a first priority level is given and a second priority group to which a second priority level is given, and the first priority level is higher than the second priority level.

8. The method of claim 7, wherein, if the length of the first priority group is referred to as "first group length" and the length of the second priority group is referred to as "second group length", the number of first code rate bits is greater than the first group length, and the number of second code rate bits is less than the second group length.

9. An apparatus for generating frames to apply error correction to data including a plurality of consecutive data groups, the apparatus comprising:
   at least one processor that processes computer executable program code embodied in a recording medium, the computer executable program code comprising:
   a number-of-first-code-rate-bits calculating program code that, upon receiving input of an n-th data group consisting of a plurality of priority groups with different priority levels, calculates a number of first code rate bits, which is a number of data bits in an n-th data group for which a first code rate is to be used, based on a ratio of a length of data in an (n−1)-th data group for which the first code rate is used;
   a number-of-first-code-rate-frames calculating program code that calculates a number of first code rate frames, which is a number of frames in the n-th data group for which the first code rate is used, based on the number of first code rate bits;
   a number-of-second-code-rate-bits calculating program code that calculates a number of second code rate bits, which is a number of data bits in the n-th data group for which a second code rate is used, based on the number of first code rate bits;

a number-of-second-code-rate-frames calculating program code that calculates a number of second code rate frames, which is a number of frames in the n-th data group for which the second code rate is used, based on the number of second code rate bits; and a frame generating program code that generates frames for which the first code rate is used based on the number of first code rate frames and generates frames for which the second code rate is used based on the number of second code rate frames, and a length ratio correcting program code that corrects the ratio of a first code rate length if ratio of the first code rate length, which is a ratio of the length of data in the (n−1)-th data group for which the first code rate is used, is not consistent with a predetermined ratio.

10. The apparatus of claim 9, wherein the length ratio correcting program code calculates the corrected ratio of the first code rate length by subtracting the ratio of first code rate length from the predetermined ratio and then adding a new predetermined ratio to the difference.

11. The apparatus of claim 9, wherein the number-of-first-code-rate-bits calculating program code calculates the number of first code rate bits in the n-th data group by adding the length of the n-th data group and the number of non-encoded data bits in the (n−1)-th data group and then multiplying the sum by the corrected ratio of first code rate length.

12. The apparatus of claim 9, wherein the number-of-first-code-rate-frames calculating program code calculates the number of first code rate frames by adding the number of first code rate bits in the n-th data group and the number of non-encoded data bits in the n-th data group and then dividing the sum by a predetermined number of bit strings.

13. The apparatus of claim 9, wherein the number-of-second-code-rate-bits calculating program code calculates the number of second code rate bits by removing the first code rate bits from the n-th data group.

14. The apparatus of claim 9, wherein the number-of-second-code-rate-frames calculating program code calculates the number of second code rate frames by adding the number of second code rate bits in the n-th data group and the number of non-encoded data bits in the n-th data group and then dividing the sum by a predetermined number of bit strings.

* * * * *